(12) United States Patent
Tran et al.

(10) Patent No.: US 10,948,555 B2
(45) Date of Patent: Mar. 16, 2021

(54) MAGNETIC FIELD SENSOR AND MAGNETORESISTANCE ELEMENT STRUCTURE HAVING AT LEAST TWO MAGNETORESISTANCE ELEMENTS DISPOSED IN A PROXIMATE ARRANGEMENT

(71) Applicant: Allegro MicroSystems, LLC, Manchester, NH (US)

(72) Inventors: Sam Tran, Lee, NH (US); Rémy Lassalle-Balier, Bures sur Yvette (FR)

(73) Assignee: Allegro MicroSystems, LLC, Manchester, NH (US)

( * ) Notice: Subject to any disclaimer, the term of this patent is extended or adjusted under 35 U.S.C. 154(b) by 59 days.

(21) Appl. No.: 16/420,470

(22) Filed: May 23, 2019

(65) Prior Publication Data
US 2020/0371170 A1 Nov. 26, 2020

(51) Int. Cl.
*G01R 33/09* (2006.01)
*H01L 43/08* (2006.01)

(52) U.S. Cl.
CPC ......... *G01R 33/091* (2013.01); *G01R 33/093* (2013.01); *H01L 43/08* (2013.01)

(58) Field of Classification Search
CPC ...... G01R 33/091; G01R 33/093; H01L 43/08
USPC ....................................................... 324/252
See application file for complete search history.

(56) References Cited

U.S. PATENT DOCUMENTS

| | | | | |
|---|---|---|---|---|
| 5,585,719 A | * | 12/1996 | Endo | G01D 5/142 324/174 |
| 5,946,228 A | * | 8/1999 | Abraham | G11C 11/1675 365/173 |
| 6,214,487 B1 | * | 4/2001 | Kelley | H01M 10/48 429/430 |
| 6,267,864 B1 | * | 7/2001 | Yadav | B01D 53/32 205/341 |
| 6,781,359 B2 | | 8/2004 | Stauth et al. | |
| 7,795,862 B2 | | 9/2010 | Doogue et al. | |

(Continued)

OTHER PUBLICATIONS

Millen, R.L., Kawaguchi, T., Granger, M.C., Porter, M.D. and Tondra, M., 2005. Giant magnetoresistive sensors and superparamagnetic nanoparticles: a chip-scale detection strategy for immunosorbent assays. Analytical chemistry, 77(20), pp. 6581-6587. (Year: 2005).*

(Continued)

*Primary Examiner* — Christopher P McAndrew
(74) *Attorney, Agent, or Firm* — Daly, Crowley, Mofford & Durkee, LLP

(57) ABSTRACT

A magnetoresistance element structure disposed parallel to an x-y plane defined by an x-axis and a y-axis orthogonal to the x-axis can include a first magnetoresistance element having a plurality of first shapes coupled in series to result in the first magnetoresistance element having a first serpentine shape parallel to the x-y plane; and a second magnetoresistance element having a plurality of second shapes coupled in series to result in the second magnetoresistance element having a second serpentine shape parallel to the x-y plane, wherein the plurality of first shapes and the plurality of second shapes are disposed in an interdigitated pattern. A magnetic field sensor can use the above magnetoresistance element structure. Nested magnetoresistance elements and magnetic field sensors are also described.

24 Claims, 10 Drawing Sheets

(56) References Cited

U.S. PATENT DOCUMENTS

| | | | |
|---|---|---|---|
| 9,417,296 B2* | 8/2016 | Akiyama | G01R 33/093 |
| 9,719,806 B2 | 8/2017 | Foletto et al. | |
| 2002/0032531 A1* | 3/2002 | Mansky | B01J 19/0046 |
| | | | 702/21 |
| 2005/0171703 A1* | 8/2005 | Goldfine | G01N 27/9013 |
| | | | 702/30 |
| 2007/0007955 A1* | 1/2007 | Goldfine | G01N 27/82 |
| | | | 324/240 |
| 2013/0320972 A1* | 12/2013 | Loreit | G01R 33/093 |
| | | | 324/252 |
| 2014/0113828 A1* | 4/2014 | Gilbert | H01L 39/225 |
| | | | 505/100 |
| 2014/0145301 A1* | 5/2014 | Moghe | H01L 27/0292 |
| | | | 257/532 |
| 2017/0356759 A1* | 12/2017 | David | G01P 3/488 |

OTHER PUBLICATIONS

Elmatboly, O., Homaifar, A. and Zolghadri, M., Nov. 2005. Giant magneto resistive sensing of critical power system parameters. In 31st Annual Conference of IEEE Industrial Electronics Society, 2005. IECON 2005. (pp. 6-pp). IEEE. (Year: 2005).*

* cited by examiner

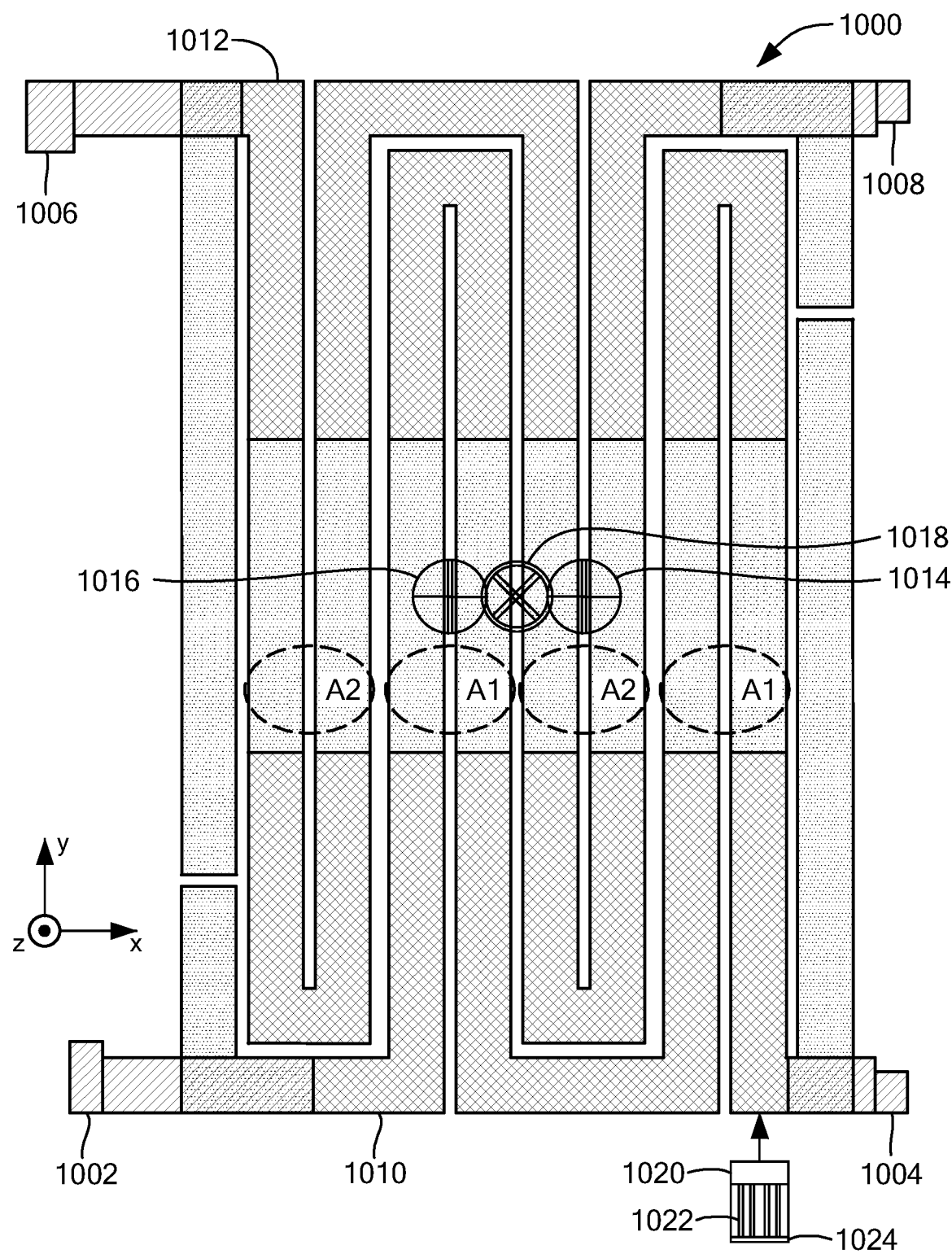
*FIG. 10*  *FIG. 10A*

MAGNETIC FIELD SENSOR AND MAGNETORESISTANCE ELEMENT STRUCTURE HAVING AT LEAST TWO MAGNETORESISTANCE ELEMENTS DISPOSED IN A PROXIMATE ARRANGEMENT

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors and, more particularly, to a magnetic field sensor having at least two magnetoresistance elements disposed in a proximate interdigitated or nested arrangement.

BACKGROUND

A magnetic field sensor can be used to sense a magnetic field generated by an electrical current flowing through a conductor. These magnetic field sensors can be referred to as current sensors.

Referring to FIG. 1, a typical magnetic field sensor 100 can form a movement detector, operable to detect a movement of a ferromagnetic target object 106. The ferromagnetic target object 106 can be disposed over the magnetic field sensor 100, i.e., displaced in a direction parallel to a z-axis.

The magnetic field sensor 100 can include eight magnetoresistance elements, here labeled A1, A2, B1, B2, C1, C2, D1, and D2, arranged in four pairs, all disposed over a common substrate 102, for example, a semiconductor substrate. A largest surface of the substrate 102 can be disposed in an x-y plane.

The ferromagnetic target 106 can include ferromagnetic features 106a-106d (e.g., alternating gear teeth and gear valleys of a gear).

In a so-called "back-biased" arrangement" a magnet 108 can be coupled to or coupled within the magnetic field sensor 100 and disposed under the magnetic field sensor 100. For the back-biased arrangements, the eight magnetoresistance elements A1, A2, B1, B2, C1, C2, D1, and D2 are responsive to a magnetic field generated by the magnet 108, and more particularly, to changes in amplitude and angle of the magnetic field generated by the magnet 108 as the ferromagnetic (e.g., steel) target object 106 moves.

The eight magnetoresistance elements A1, A2, B1, B2, C1, C2, D1, and D2 can have respective maximum response axes parallel to the x-axis and can be responsive to a movement of the ferromagnetic target object 106 in one or two directions parallel to the x-axis as indicated by line 110.

With conventional yoke-shaped magnetoresistance elements, the eight magnetoresistance elements A1, A2, B1, B2, C1, C2, D1, and D2 can have magnetically sensitive regions limited to eight respective regions of boxes 100a-100h. Ends of the yokes beyond the boxes 100a-100h may not responsive to magnetic fields due to connections of the ends of the yokes beyond the boxes 100a-100h to metal layers below, as will be understood from figures below. The ends of the yokes beyond the boxes 100a-100h can instead provide improved linear region characteristics of the magnetoresistance elements, as will be understood. Yoke shaped magnetoresistance elements are conventionally used for linear magnetic field detection, as opposed to non-yoke-shaped magnetoresistance elements, that tend to be used for non-linear (e.g., two-state) application.

Referring now to FIG. 2, which also applies to figures thereafter, the eight magnetoresistance elements A1, A2, B1, B2, C1, C2, D1, and D2 can be coupled in two bridge circuits to generate two differential signals, related to so-called "speed signals," each having a respective cycle period indicative of a speed of motion of the target object 106, and each having a different phase, a sign of which is indicative of a direction of the motion. Magnetoresistance elements A1, A2, C1, C2 can be coupled into a first bridge arrangement and magnetoresistance elements B1, B2, D1, D2 can coupled in a second bridge arrangement.

This arrangement can suffer from errors induced by different static magnetic fields generated by the magnet 108 within the sensitive regions 100a-100h. Static magnetic fields are those fields that are generated by the magnet 108 at positions of the eight magnetoresistance elements A1, A2, B1, B2, C1, C2, D1, and D2 when the ferromagnetic target object 106 is not present at all. The static fields can still be different in the regions 100a-100h in directions parallel to the x-direction and also in directions parallel to the y-direction.

The above described different static magnetic fields experienced by the eight magnetoresistance elements A1, A2, B1, B2, C1, C2, D1, and D2 can result in different "offset" voltages generated by the first and second bridge arrangements when the ferromagnetic target object 106 is not present, which is undesirable.

It would, therefore, be desirable to provide a back-biased magnetic field sensor for which errors resulting from static fields are reduced, the different static fields experienced by the eight magnetoresistance elements A1, A2, B1, B2, C1, C2, D1, and D2 when coupled in two bridge arrangements.

SUMMARY

The present invention provides a back-biased magnetic field sensor for which errors resulting from static fields are reduced, the different static fields experienced by eight magnetoresistance elements when coupled in two bridge arrangements. However, similar techniques can be applied to non-back-biased arrangements.

In accordance with an example useful for understanding an aspect of the present invention, a magnetoresistance element structure disposed parallel to an x-y plane defined by an x-axis and a y-axis orthogonal to the x-axis can include a first magnetoresistance element having a plurality of first shapes coupled in series to result in the first magnetoresistance element having a first serpentine shape parallel to the x-y plane; and a second magnetoresistance element having a plurality of second shapes coupled in series to result in the second magnetoresistance element having a second serpentine shape parallel to the x-y plane, wherein the plurality of first shapes and the plurality of second shapes are disposed in an interdigitated pattern.

In accordance with an example useful for understanding another aspect of the present invention, a magnetic field sensor can include a back-biasing magnet for generating a back-biasing magnetic field; a substrate disposed proximate to the back-biasing magnet, the substrate having a largest surface parallel to an x-y plane; first magnetoresistance element disposed upon the substrate and having a plurality of first shapes coupled in series to result in a first serpentine shape parallel to the x-y plane; and a second magnetoresistance element disposed upon the substrate and having a plurality of second shapes coupled in series to result in a second serpentine shape parallel to the x-y plane, wherein the plurality of first shapes and the plurality of second shapes are disposed in an interdigitated pattern, wherein the first magnetoresistance element and the second magnetoresistance element experience the back-biasing magnetic field.

In accordance with an example useful for understanding another aspect of the present invention, a magnetoresistance element structure can be disposed parallel to an x-y plane defined by an x-axis and a y-axis orthogonal to the x-axis. The magnetoresistance element structure can include a first plurality of magnetoresistance elements, each having a respective yoke shape and each having a different respective length dimension parallel to the x-y plane, at least one of the first plurality of magnetoresistance elements being nested to fit inside another one of the first plurality of magnetoresistance elements. The magnetoresistance element structure can also include a second plurality of magnetoresistance elements, each having a respective yoke shape and each having a different respective length dimension parallel to the x-y plane, at least one of the second plurality of magnetoresistance elements being nested to fit inside another one of the second plurality of magnetoresistance elements, the first plurality of magnetoresistance elements disposed proximate to the second plurality of magnetoresistance elements.

In accordance with an example useful for understanding another aspect of the present invention, a magnetic field sensor can include a back-biasing magnet for generating a back-biasing magnetic field. The magnetic field sensor can also include a first plurality of magnetoresistance elements, each having a respective yoke shape and each having a different respective length dimension parallel to the x-y plane, at least one of the first plurality of magnetoresistance elements being nested to fit inside another one of the first plurality of magnetoresistance elements. The magnetic field sensor can also include a second plurality of magnetoresistance elements, each having a respective yoke shape and each having a different respective length dimension parallel to the x-y plane, at least one of the second plurality of magnetoresistance elements being nested to fit inside another one of the second plurality of magnetoresistance elements, the first plurality of magnetoresistance elements disposed proximate to the second plurality of magnetoresistance elements. The first plurality of magnetoresistance elements and the second plurality of magnetoresistance elements can experience the back-biasing magnetic field.

BRIEF DESCRIPTION OF THE DRAWINGS

The foregoing features of the invention, as well as the invention itself may be more fully understood from the following detailed description of the drawings, in which:

FIG. 10 is an electrical layout drawing of the two magnetoresistance elements of FIG. 6 showing magnetically active regions, magnetically inactive regions, and electrical contacts; and FIG. 10A is a cross section showing a view of part of one of the two magnetoresistance elements of FIG. 10.

DETAILED DESCRIPTION

Figure 1:
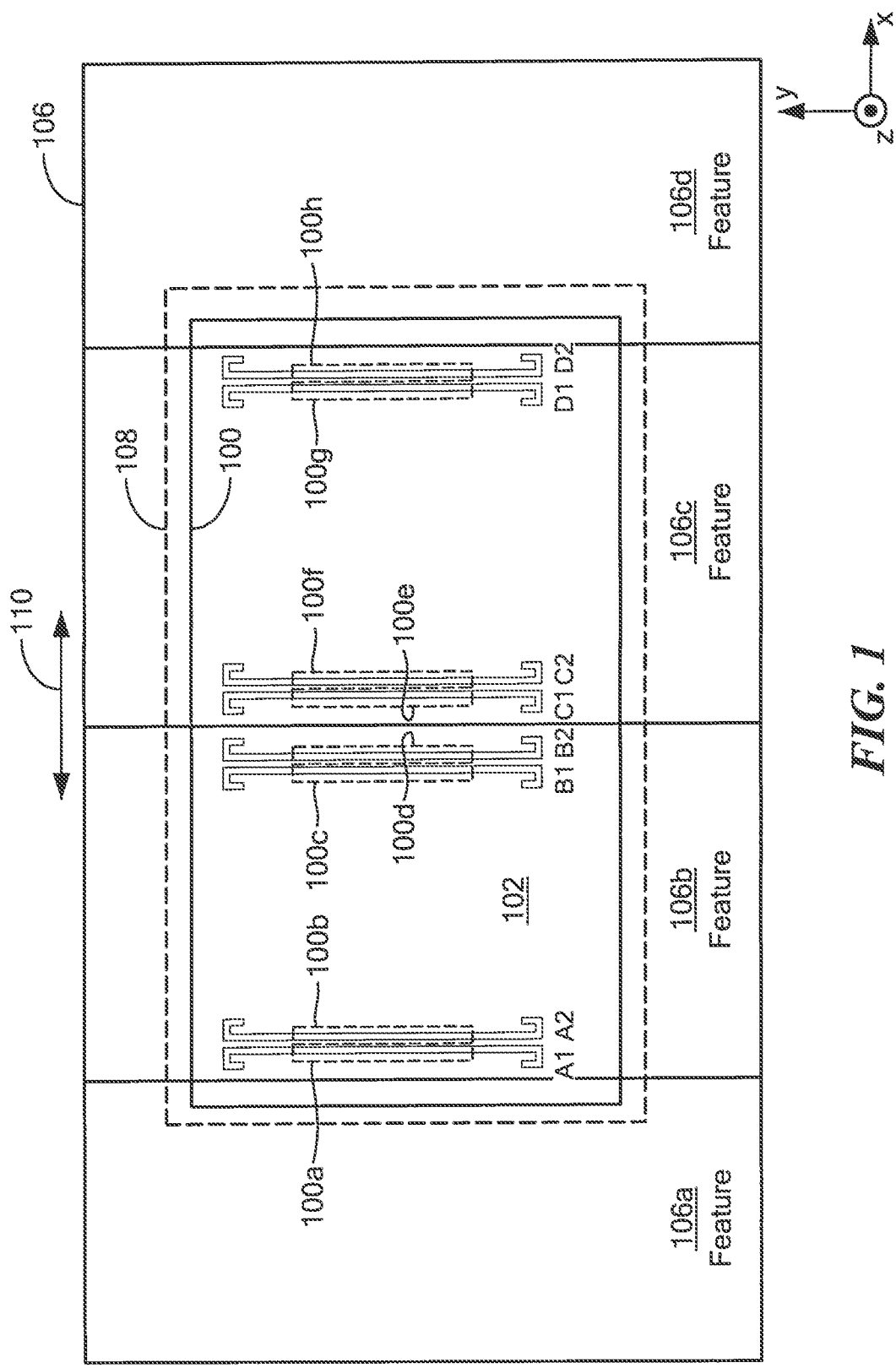
FIG. 1 is a block diagram showing a conventional back-biased magnetic field sensor having eight magnetoresistance elements.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe an assembly that uses a magnetic field sensing element in combination with an electronic circuit, all disposed upon a common substrate, e.g., a semiconductor substrate. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

The terms "parallel" and "perpendicular" are used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/−ten degrees.

Magnetoresistance elements, for example, GMR elements, having yoke shapes are used in examples herein.

Figure 3:
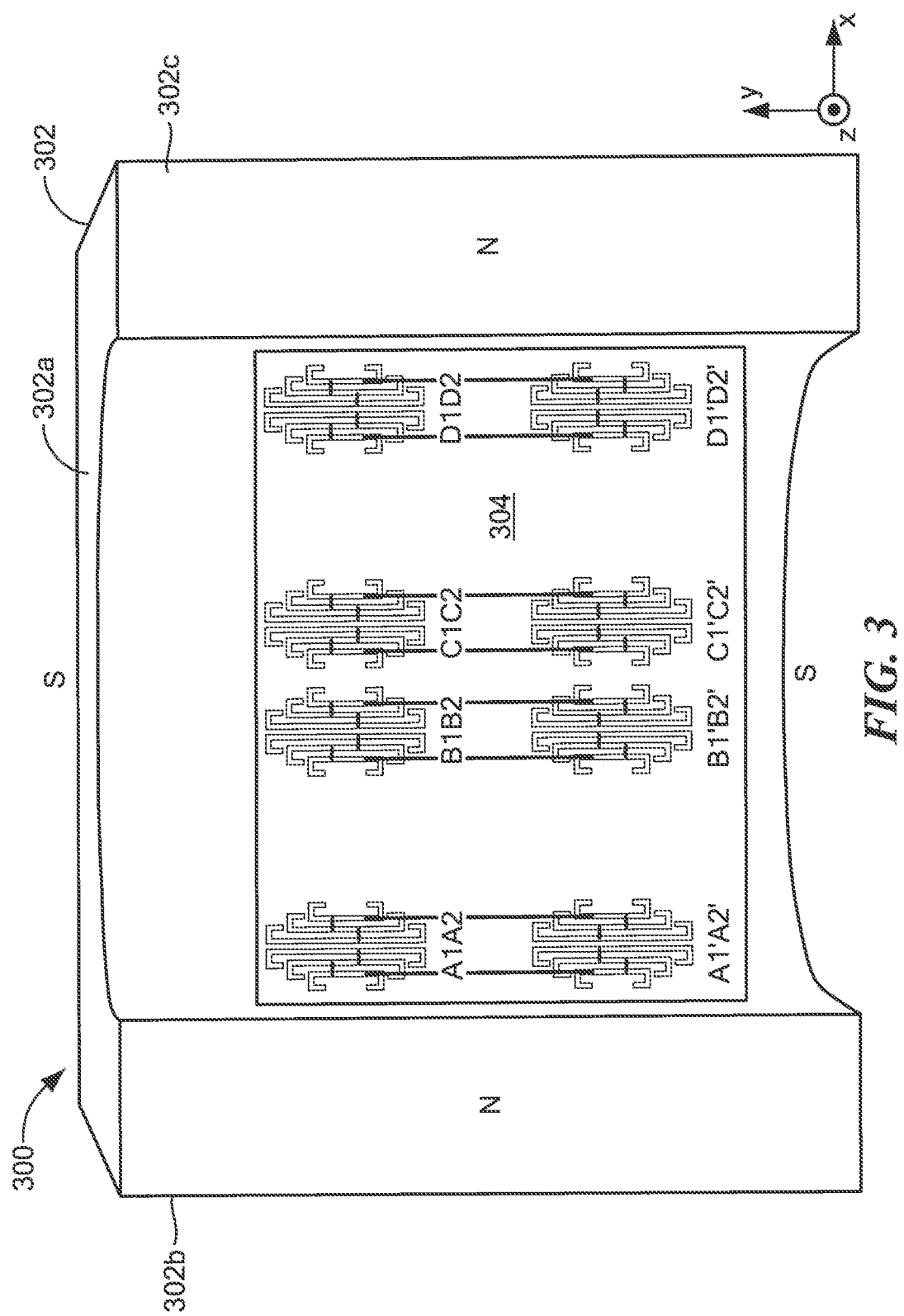
FIG. 3 is perspective drawing showing sixteen groups of four magnetoresistance elements, electrically coupled pairs of the sixteen groups of magnetoresistance elements electrically coupled together in eight electrically coupled pairs to form eight effective magnetoresistance elements, and for which physically adjacent pairs of the sixteen groups of four magnetoresistance elements are formed as eight magnetoresistance element structures and showing a particular back-biasing magnet.

Referring now to FIG. 3, a magnetic field sensor can include a substrate, e.g., a semiconductor substrate, upon which can be disposed sixteen groups, A1, A2, A1', A2', B1, B2, B1', B2', C1, C2, C1', C2', D1, D2, D1', D2' of three magnetoresistance elements disposed upon a substrate 304. Electrically coupled pair of groups A1A1', A2A2', B1B1', B2B2', C1C1', C2C2', D1D1', D2D2' of the sixteen groups of magnetoresistance elements can be electrically coupled together in eight electrically coupled pairs of groups to form eight effective magnetoresistance elements A1A1', A2A2', B1B1', B2B2', C1C1', C2C2', D1D1', D2D2'. Physically adjacent pairs of groups A1A2, A1'A2', B1B2, B1'B2', C1C2, C1'C2', D1D2, D1'D2' of the sixteen groups of three magnetoresistance elements can be formed as eight so-called "magnetoresistance element structures" A1A2, A1'A2', B1B2, B1'B2', C1C2, C1'C2', D1D2, D1'D2'.

The magnetic field sensor can also include a magnet 302 having a permanent magnetism. The magnet 302 can have a back portion 302a and two legs 302b, 302c extending at an angle of approximately ninety degrees from ends of the back portion 302a. The substrate 304 can be disposed between the two legs 302b, 302c and can at an orientation such that a largest surface of the substrate 304 is parallel to a largest surface of the back portion 302a.

This magnet 302 can provide a largely uniform magnetic field to the magnetoresistance elements. However, still there are difference in static magnetic fields at different ones of the magnetoresistance elements along directions parallel to an x-axis and along directions parallel to a y-axis, wherein the substrate is disposed in an x-y plane. For reasons described above, this difference is undesirable.

Within a magnetoresistance elements structure, e.g., A1A2, nesting of the three magnetoresistance elements A1 and nesting of the three magnetoresistance elements A2 places the three magnetoresistance elements A1 in closer proximity to the three magnetoresistance elements A2 than would be provided without the nesting. Thus, there will be a smaller static magnetic field difference between positions the four magnetoresistance elements A1 positions of the four magnetoresistance elements A2.

Each magnetoresistance element with a group of three magnetoresistance elements, e.g., A1, can be shorter than any one of the magnetoresistance elements of FIG. 1, to allow a split arrangement having, for example, A1 and A1'. Being shorter, any one of the three nested magnetoresistance elements can have a resistance that is undesirably low. Thus, the three (or any number more than two) magnetoresistance elements can be coupled in series to achieve a desirable resistance.

The two groups of magnetoresistance elements, e.g., A1 and A1', can be separated as shown, so that the two groups of magnetoresistance element, e.g., A1, A1', experience a more uniform magnetic field experienced as generated by the magnet 302.

Figure 2:
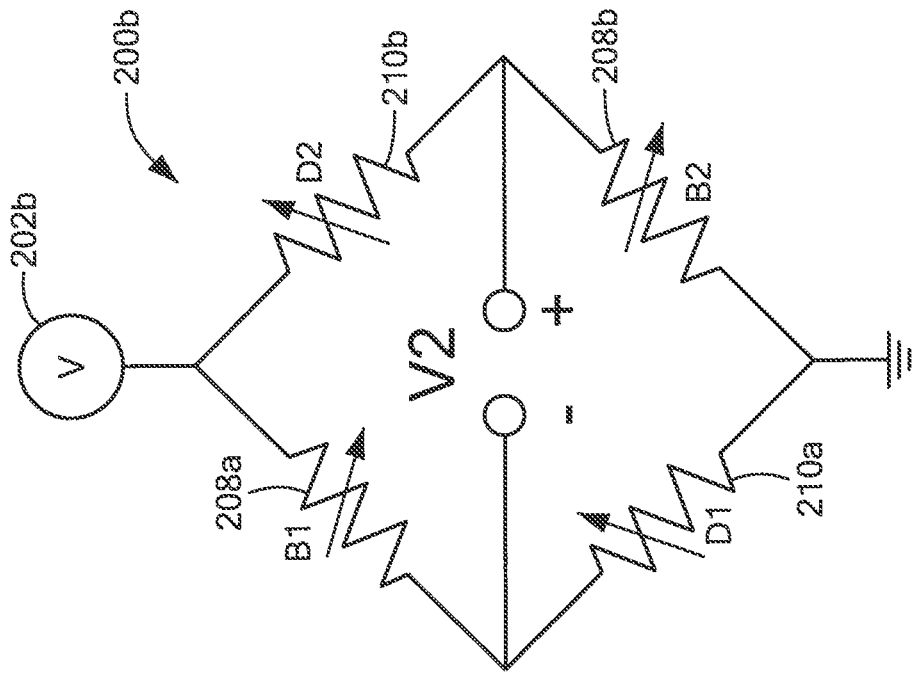
FIG. 2 is a schematic diagram showing eight magnetoresistance elements, which can be the eight magnetoresistance elements of the magnetic field sensor of FIG. 1 or of any magnetic field sensors described in figures below, wherein the eight magnetoresistance elements are coupled in two bridge arrangements to generate two magnetic field signals.
Figure 2:
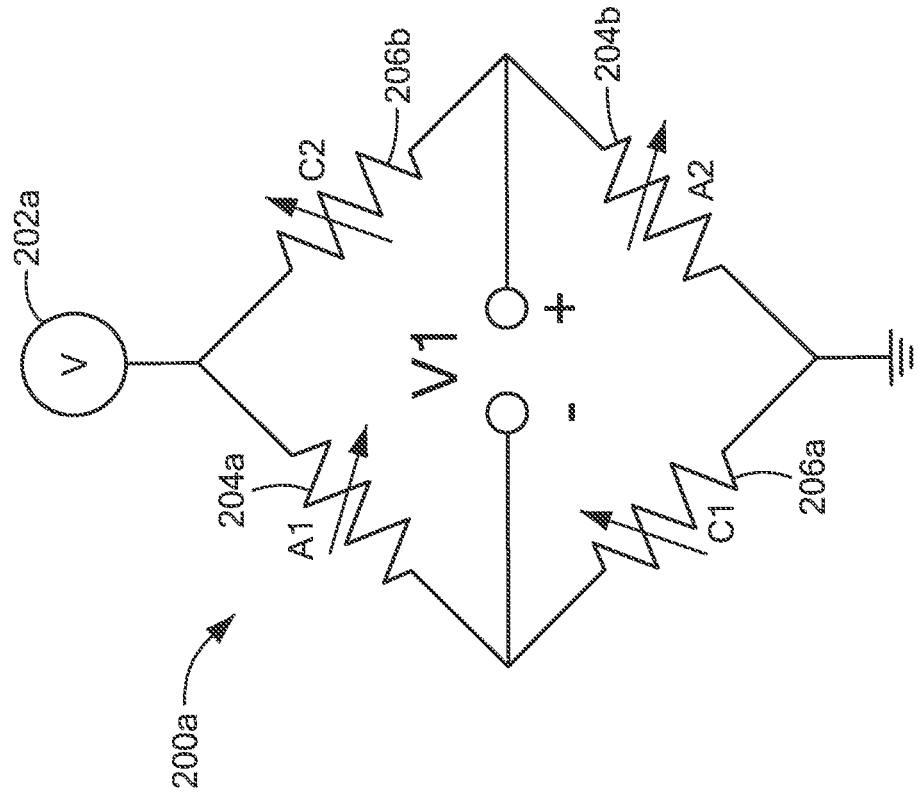
Figure 4:
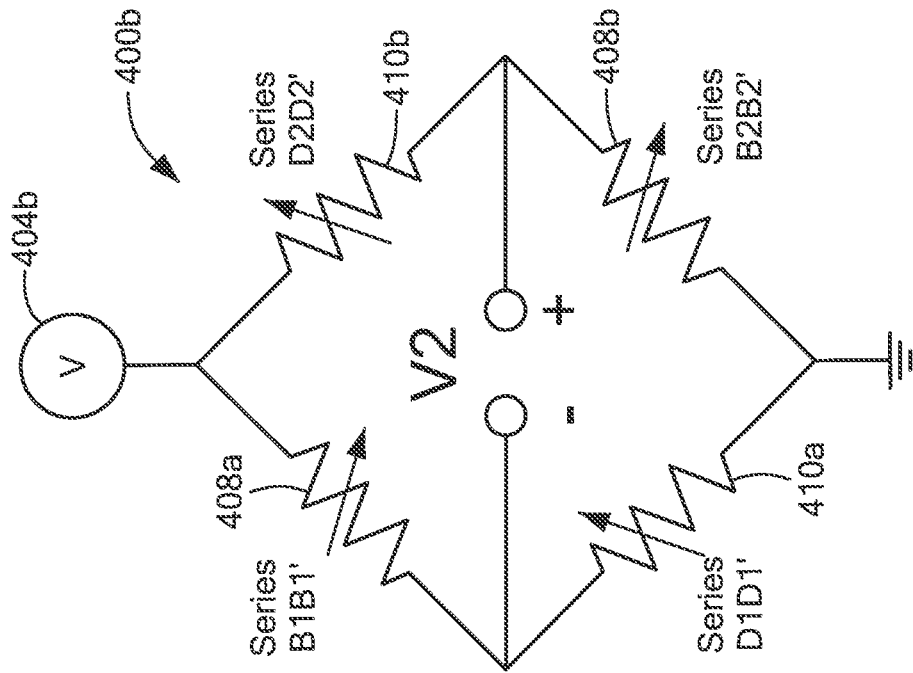
FIG. 4 is a schematic showing the sixteen groups of four magnetoresistance elements coupled in two bridges to generate two magnetic field signals.
Figure 4:
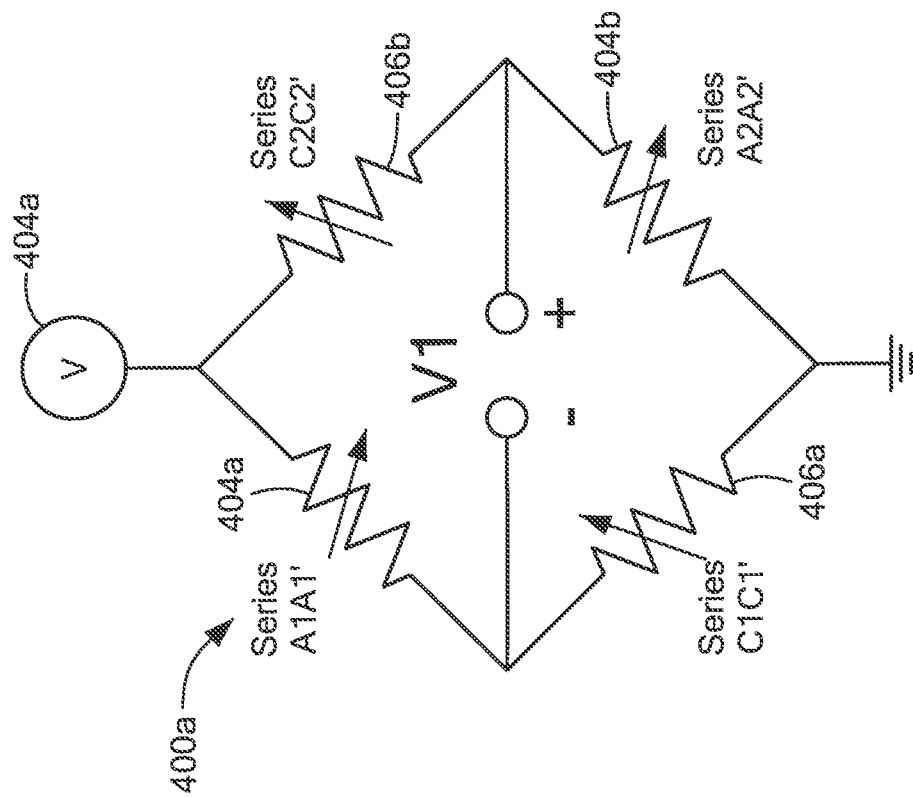

Referring now to FIG. 4, in which like elements of FIG. 3 are shown having like reference designations, the electrically coupled pairs of groups of magnetoresistance elements A1A1', A2A2', C1C1', C2C2' can be coupled in a first bridge arrangement and the electrically coupled pairs of groups of magnetoresistance elements B1B1', B2B2', D1D1', D2D2' can be coupled in a second bridge arrangement to result in two differential signal V1, V2 that can be comparable to the two differential signals V, V2 of FIG. 2.

It should be apparent how differences of static magnetic field at positions of the magnetoresistance elements, e.g., the group of elements A1 versus the group of elements A2, can result in offset voltages in the differential signals V1, V2.

Figure 5:
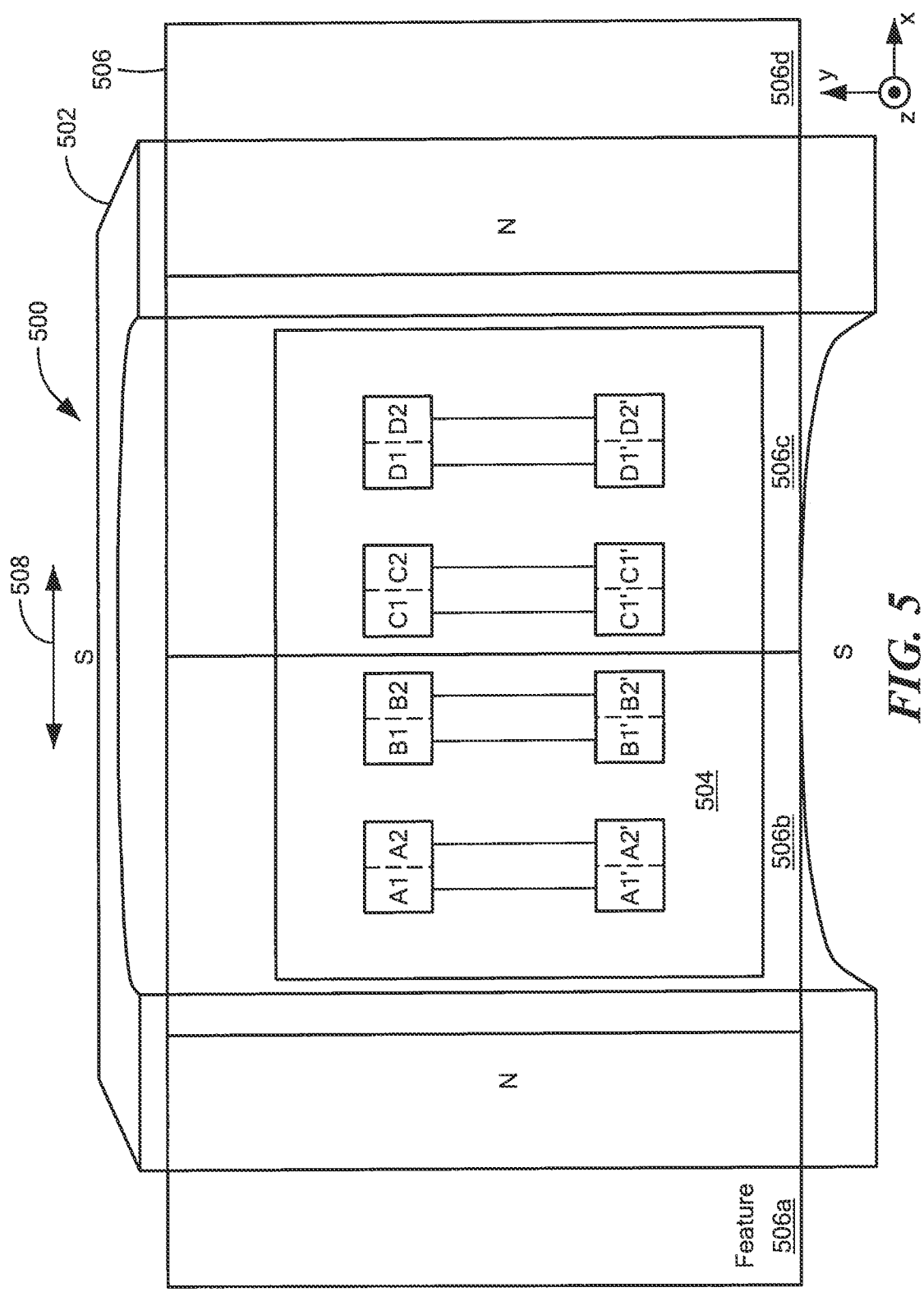
FIG. 5 is perspective drawing showing sixteen groups of magnetoresistance elements, electrically pairs of the sixteen groups of magnetoresistance elements electrically coupled together in eight electrically coupled pairs to form eight effective magnetoresistance element, and for which physically adjacent pairs of the sixteen groups of magnetoresistance elements are formed as eight magnetoresistance element structures, and showing a particular back-biasing magnet and an illustrative ferromagnetic target object.

Referring now to FIG. 5, with reference to FIG. 3, a more generalized magnetic field sensor can include the sixteen groups, A1, A2, A1', A2', B1, B2, B1', B2', C1, C2, C1', C2', D1, D2, D1', D2' of four magnetoresistance elements disposed upon a substrate 504. Electrically coupled pairs of groups AA1', A2A2', B1B1', B2B2', C1C1', C2C2', D1D1', D2D2' of the sixteen groups of magnetoresistance elements electrically can be coupled together in eight electrically coupled pairs of groups to form eight effective magnetoresistance elements A1A1', A2A2', B1B1', B2B2', C1C1', C2C2', D1D1', D2D2'. Physically adjacent pairs of groups A1A2, A1'A2', B1B2, B1'B2', C1C2, C1'C2', D1D2, D1'D2' of the sixteen groups of four magnetoresistance elements can be formed as eight magnetoresistance element structures A1A2, A1'A2', B1B2, B1'B2', C1C2, C1'C2', D1D2, D1'D2'.

A magnet 502 can be the same as or similar to the magnet 302 of FIG. 3. A ferromagnetic target object 506a having features 506a, 506b, 506c, 506d can be the same as or similar to the ferromagnetic target object 106 of FIG. 1 and can be operable to move in direction represented by and arrow 508.

While certain magnetoresistance element structures A1A2, A1'A2', B1B2, B1'B2', C1C2, C1'C2', D1D2, D1'D2' are shown in FIG. 3, different magnetoresistance element structures are described in conjunction with figures below.

Figure 6:
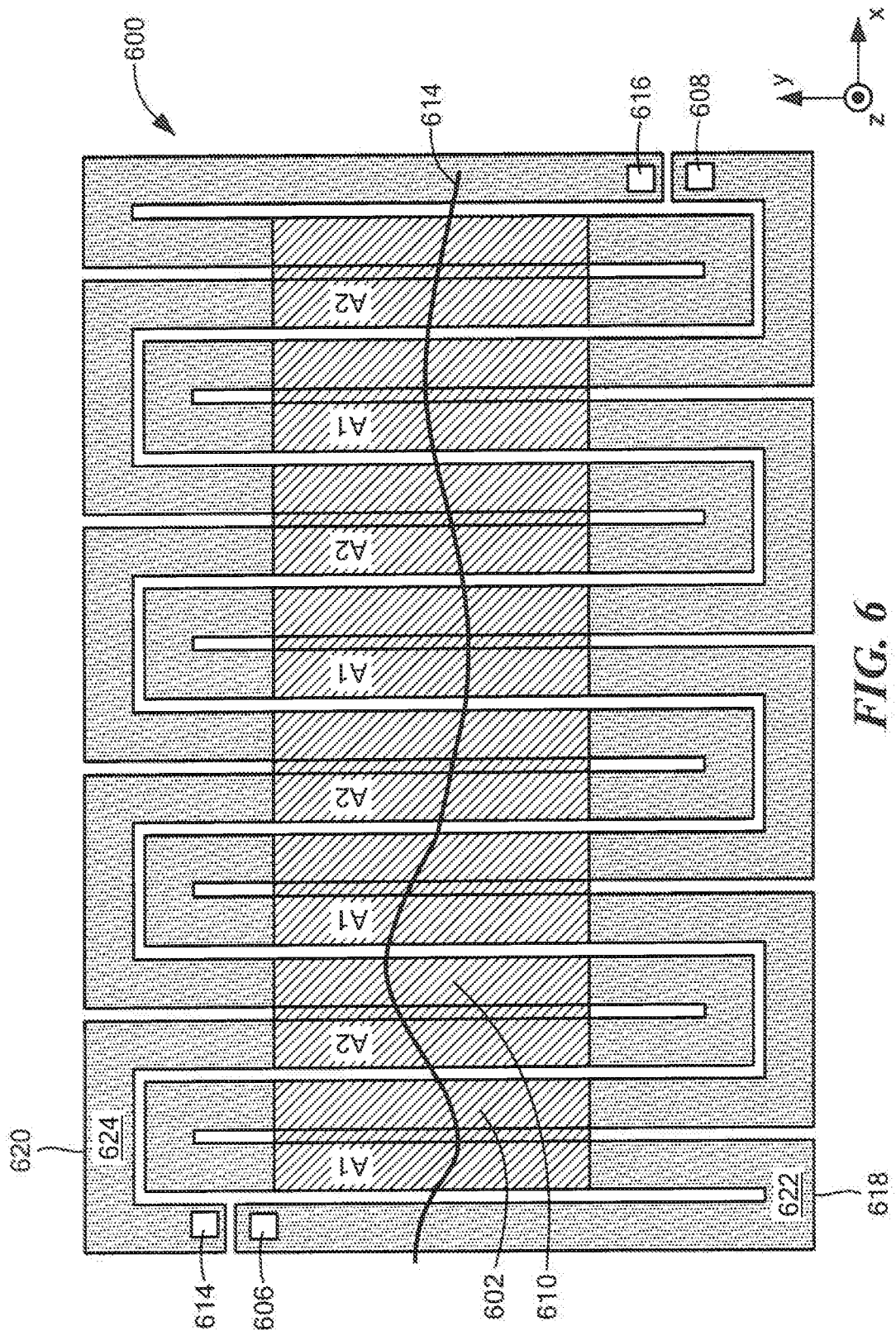
FIG. 6 is a pictorial drawing showing two magnetic elements, each having a serpentine shape, and the two magnetoresistance elements being interdigitated, wherein the two magnetoresistance elements can be same as or similar to one of the magnetoresistance element structures of FIG. 5.

Referring now to FIG. 6, a magnetoresistance element structure 600 can be like any one of the magnetoresistance element structures A1A2, A'A2', B1B2, B1'B2', C1C2, C1'C2', D1D2, D1'D2' of FIG. 5. However, the magnetoresistance element structure 600 is shown to be like the magnetoresistance element structure A1A2 comprised of a pair of proximate first and second magnetoresistance elements 618, 620, respectively.

The first magnetoresistance element 618 has a first serpentine shape or pattern from a top view of the arrangement of FIG. 5. The second magnetoresistance element 620 has a second serpentine shape or pattern from a top view of the arrangement of FIG. 5.

The first and second shapes are interdigitated. Accordingly, magnetically active regions A1, A2 can be referred to herein as "digits." The magnetoresistance structure 600 has four A1 digits and four A2 digits, which are interdigitated. Other numbers of digits can be used, including one A1 digit and one A2 digit.

The serpentine shapes provide advantages of those provided by the yoke shape shown in FIG. 1.

The first magnetoresistance element 618 has a plurality of magnetically active regions, e.g., magnetically active region 602. The second magnetoresistance element 620 has a plurality of magnetically active regions, e.g., magnetically active region 610. Other regions of the first and second magnetoresistance elements 618, 620 can be magnetically inactive. For example, those magnetically inactive regions can be coupled through vias to metal layers below.

The first magnetoresistance element 618 has terminal nodes 606, 608 at which electrical connections can be made. The second magnetoresistance element 620 has terminal nodes 614, 616 at which electrical connections can be made.

Other regions (other than A1 and A2), e.g., 622, 624, can be coupled, e.g., through vias, to one or more underlying metal layers, resulting in the other regions 622, 624 acting as low resistance paths, for example, to the terminal nodes 606, 608 and 614, 616.

A line 614 is indicative of a static magnetic field across the magnetoresistance element structure 600 in a direction parallel to an x-direction.

The interdigitated pattern provides two geometric advantages.

First, because of the first and second serpentine patterns of the first and second magnetoresistance elements 618, 620, a magnetic field experienced by the first and second magnetoresistance elements 618, 620 is necessarily averaged. In other words, and taking the first magnetic field sensing element 618 as an example, portions of the first magnetic field sensing element 618 experience higher static magnetic fields at some portions and lower static magnetic fields at other portions. The higher and lower static magnetic fields tend to average.

Second, being interdigitated, the first and second magnetoresistance elements 618, 620 have geometric centers that are close to each other, and thus, the first and second magnetoresistance elements 618, 620 experience nearly the same static magnetic fields across the x-direction. Therefore, the first and second magnetoresistance elements 618, 620 have resistances, when coupled in the bridges of FIG. 4, that have little offset voltage in response to the static magnetic fields.

Figure 7:
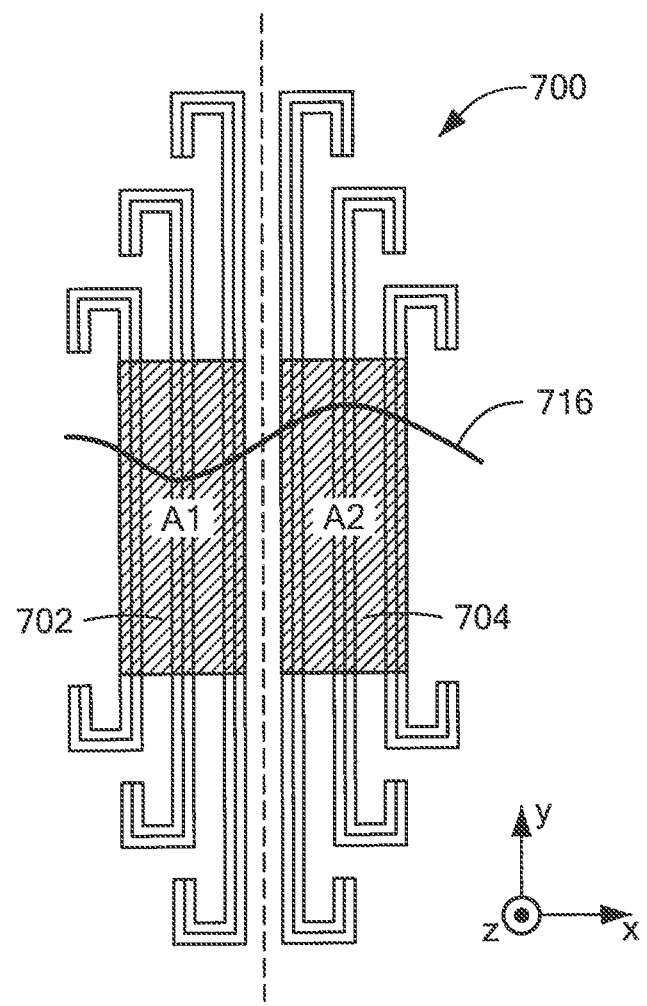
FIG. 7 is a pictorial drawing showing two groups of four magnetoresistance elements, which can be like one physically adjacent pair of the sixteen groups of magnetoresistance elements of FIGS. 3 and 5, each group of four magnetoresistance elements having magnetoresistance elements with yoke shapes and with different lengths to form a respective nested arrangement.

Referring now to FIG. 7, a magnetoresistance element structure 700 can be like any one of the several magnetoresistance element structures of FIG. 3.

A first group of magnetoresistance elements A1 can have an active region 702 and a second group of magnetoresistance elements can have an active region 704. Other regions of the first and second groups of magnetoresistance elements A1, A2 can be magnetically inactive. For example, those magnetically inactive regions can be coupled through vias to metal layers below.

As shown above in conjunction with FIG. 3, the first group of magnetoresistance elements A1 can include a first plurality of individual magnetoresistance elements coupled in series and the second group of magnetoresistance elements A2 can include a second plurality of individual magnetoresistance elements coupled in series. The first and second pluralities of magnetoresistance elements can be nested as shown, with different lengths of magnetoresistance elements, each shorter in length than any one of the magnetoresistance elements of FIG. 1, for reasons described above in conjunction with FIG. 3.

Each plurality of magnetoresistance elements, e.g., three magnetoresistance elements, is closer together in the x-direction than a similar plurality of magnetoresistance elements that are not nested. Thus, the first and second groups of magnetoresistance elements A1, A2 are closer together than would otherwise be achieved without nesting.

A line 716 is indicative of a static magnetic field across the magnetoresistance element structure 700 in a direction parallel to an x-direction.

The above described first and second geometric advantages do not pertain to the non-interdigitated magnetoresistance element structure 700. However, the close proximity of the first and second groups of magnetoresistance element A1, A2 can result in an effect similar to the second geometric advantage described above. Namely, the first and second nested magnetoresistance elements A1, A2 have geometric centers that are close to each other, and thus, the first and second groups of magnetoresistance elements A1, A2 can experience nearly the same static magnetic fields across the x-direction.

Figure 8:
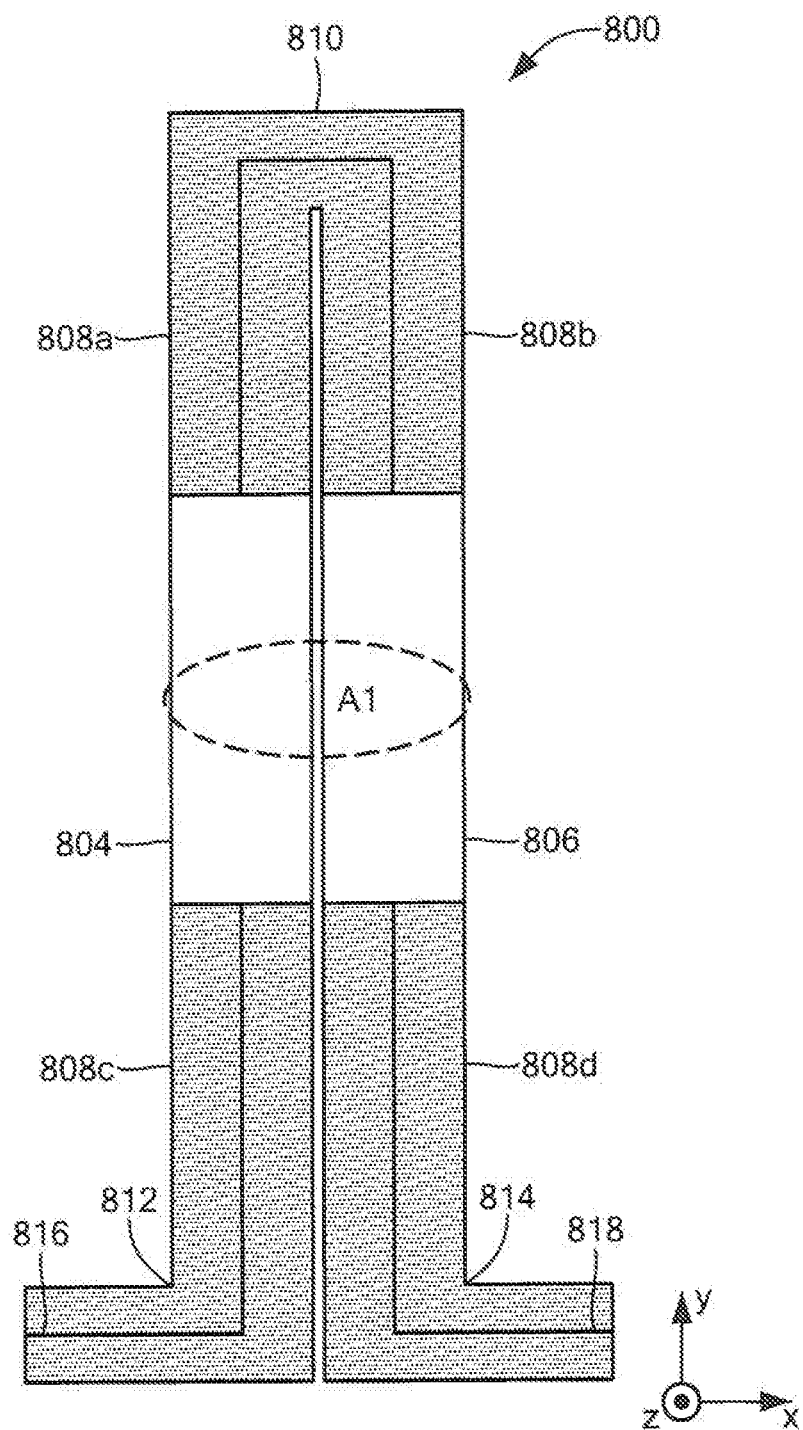
FIG. 8 is a pictorial drawing of a repeating shape of one of the two magnetoresistance elements of FIG. 6 showing magnetically active regions, magnetically inactive regions, and electrical terminations.

Referring now to FIG. 8, a portion 800 of the first magnetoresistance element 618 of FIG. 6, has a repeating pattern 800 for which the repeating pattern has a first shape one hundred eighty degree bend 810 about a first axis orthogonal to the x and y axes to form a first shape pair of parallel legs 808a, 808b. Two ends 816, 818 of the first shape pair of parallel legs 808a, 808b distal from the first shape one hundred eighty bend 810 have first shape opposing ninety degree bends 812, 814.

The repeating pattern 800 has magnetically active portions 804, 806. The rest of the repeating pattern 800 can be magnetically inactive.

Figure 9:
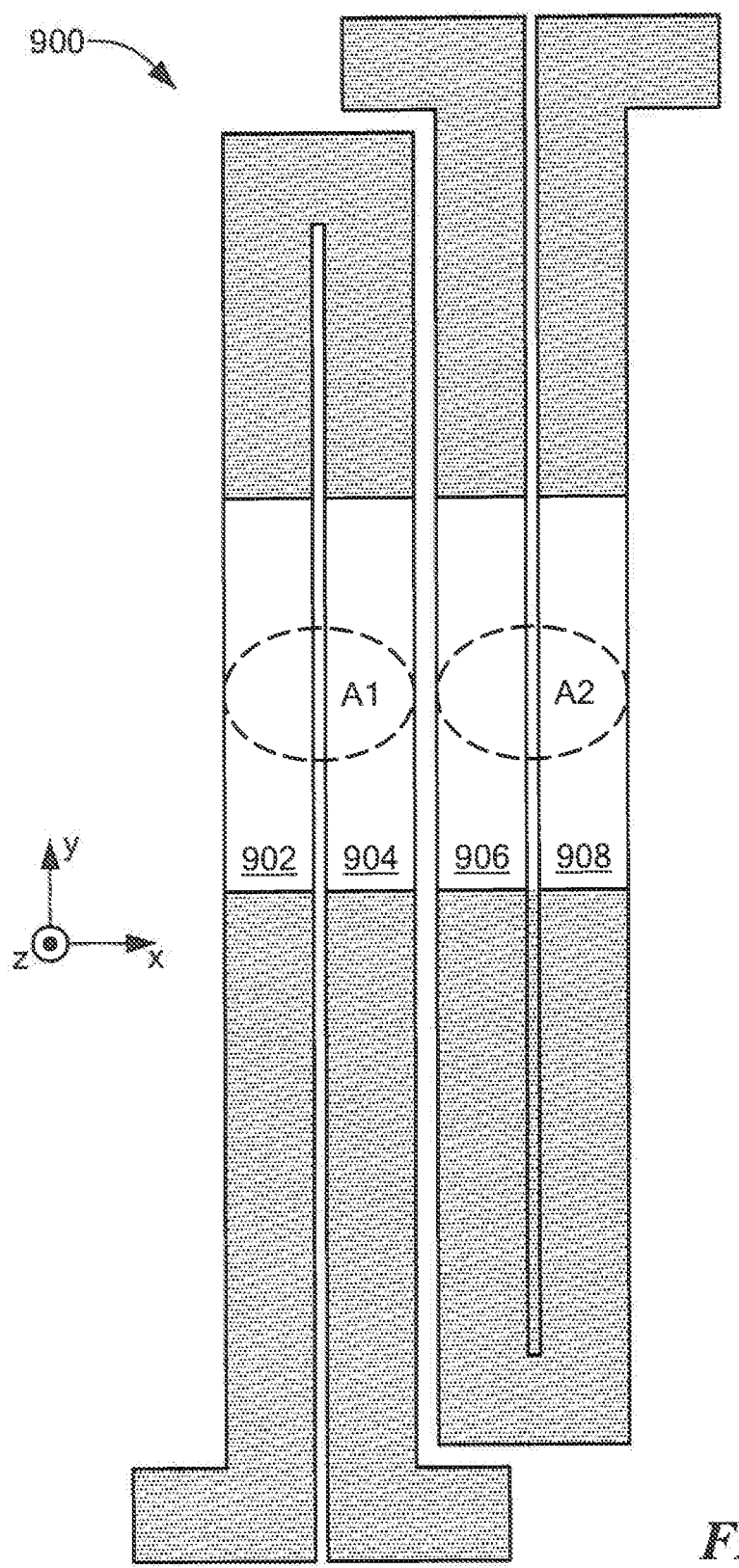
FIG. 9 is a pictorial drawing of a repeating shape of both of the two magnetoresistance elements of FIG. 6 showing magnetically active regions, magnetically inactive regions, and electrical terminations.

Referring now to FIG. 9, a portion 900 of the first and second magnetoresistance elements 618, 620 of FIG. 6, has a repeating pattern 900. The repeating pattern of the first magnetoresistance element 618 has the one hundred eight degree bend and the ninety degree bends described above in conjunction with FIG. 8. It will be recognized that a repeating pattern of the second magnetoresistance element A2 has similar bends but oriented upside down from those of the first magnetoresistance element A1.

The first magnetoresistance element 900 has magnetically active regions 902, 904 and the second magnetoresistance element A2 has magnetically active regions 906, 908.

Referring now to FIGS. 10 and 10A, with reference to FIG. 6, a layout of a magnetoresistance element structure 1000 can include a first magnetoresistance element 1010 having two digits A1 and a second magnetoresistance element 1012 having two digits A2. Each magnetoresistance element has a respective serpentine pattern. The first and second magnetoresistance elements 1010, 1012 are interdigitated.

The first magnetoresistance element 1010 can have first and second terminals 1002, 1004, between which a current can be driven. The second magnetoresistance element 1012 can have first and second terminals 1006, 1008, between which a current can be driven.

The first and second magnetoresistance elements 1010, 1012 have lighter portions indicative of magnetically active regions. The first and second magnetoresistance elements 1010, 1012 have darker portions indicative of magnetically inactive regions. Both the magnetically active regions and the magnetically inactive regions can be comprised of respective magnetoresistance elements stacks of layers 1020 extending upward from a substrate in a z-direction.

In the magnetically inactive regions, the first and second magnetoresistance elements 1010, 1012 are electrically coupled to one or more metal layers 1024 through conductive vias 1022. Thus, in the magnetically inactive regions, a current flowing through the first and second magnetoresistance elements 1010, 1012 bypasses the magnetically inactive regions of the magnetoresistance element stack of layer 1020, rendering the magnetically inactive regions to have no magnetoresistance element effect.

A point labeled 1014 is indicative of a geometric center of magnetically active regions (lighter) of the first magnetoresistance element 1010. A point labeled 1016 is indicative of a geometric center of magnetically active regions (lighter) of the second magnetoresistance element 1012. A point labeled 1018 is indicative of a geometric center of magnetically active regions (lighter) of the first and second magnetoresistance elements 1010, 1012 taken together.

As described above in conjunction with FIG. 6, being interdigitated, the first and second magnetoresistance elements 1010, 1012 have geometric centers that are close to each other, and thus, the first and second magnetoresistance elements 1010, 1012 experience nearly the same static magnetic fields across the x-direction. Therefore, the first and second magnetoresistance elements 1010, 1012 have resistances, when coupled in the bridges of FIG. 4, that have little offset voltage in response to the static magnetic fields.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A magnetoresistance element structure disposed parallel to an x-y plane defined by an x-axis and a y-axis orthogonal to the x-axis, comprising:

a first magnetoresistance element having a plurality of first shapes coupled in series to result in the first magnetoresistance element having a first serpentine shape parallel to the x-y plane; and a second magnetoresistance element having a plurality of second shapes coupled in series to result in the second magnetoresistance element having a second serpentine shape parallel to the x-y plane, wherein the plurality of first shapes and the plurality of second shapes are disposed in an interdigitated pattern, wherein the plurality of first shapes each comprise:

a first shape one hundred eighty degree bend about a first axis orthogonal to the x and y axes to form a first shape pair of parallel legs, wherein two ends of the first shape pair of parallel legs distal from the first shape one hundred eighty bend have first shape opposing ninety degree bends;

a first shape length dimension along the first shape pair of parallel legs parallel to the y-axis, and a first shape width dimension across the first shape pair of parallel legs parallel to the x-axis, the first shape width dimension less than the first shape length dimension, wherein the plurality of second shapes each comprise;

a second shape one hundred eighty degree bend about a second axis orthogonal to the x and y axes to form a second shape pair of parallel legs axis, wherein two ends of the second shape pair of parallel legs distal from the second shape one hundred eighty bend have opposing second shape ninety degree bends; and a second shape length dimension along the second shape pair of parallel legs parallel to the y-axis, and a second shape width dimension across the second shape pair of parallel legs parallel to the x-axis, the second shape width dimension less than the second shape length dimension, wherein ones of the plurality of first shapes are coupled together at ones of the first shape opposing ninety degree bends; and wherein ones of the plurality of second shapes are coupled together at ones of the second shape opposing ninety degree bends, wherein the magnetic field sensor further comprises:

a first plurality of conductive vias coupled between a portion of a first metal layer and ones of the first shapes proximate to respective ones of the first shape one hundred eighty degree bends;

a second plurality of conductive vias coupled between portion of a second metal layer and ones of the second shapes proximate to respective ones of the second shape one hundred eighty degree bends;

a third plurality of conductive vias coupled between a portion of a third metal layer and ones of the first shapes proximate to respective ones of the first shape opposing ninety degree bends; and a fourth plurality of conductive vias coupled between a portion of a fourth metal layer and ones of the second shapes proximate to respective ones of the second shape opposing ninety degree bends.

2. The magnetoresistance element structure of claim 1, wherein the first, second, third, and fourth metal layers are the same metal layer.

3. A magnetic field sensor, comprising:

a back-biasing magnet for generating a back-biasing magnetic field;

a substrate disposed proximate to the back-biasing magnet, the substrate having a largest surface parallel to an x-y plane;

a first magnetoresistance element disposed upon the substrate and having a plurality of first shapes coupled in series to result in a first serpentine shape parallel to the x-y plane; and
a second magnetoresistance element disposed upon the substrate and having a plurality of second shapes coupled in series to result in a second serpentine shape parallel to the x-y plane, wherein the plurality of first shapes and the plurality of second shapes are disposed in an interdigitated pattern,
wherein the first magnetoresistance element and the second magnetoresistance element experience the back-biasing magnetic field, wherein the plurality of first shapes each comprise:
a first shape one hundred eighty degree bend about a first axis orthogonal to the x and y axes to form a first shape pair of parallel legs, wherein two ends of the first shape pair of parallel legs distal from the first shape one hundred eighty bend have first shape opposing ninety degree bends;
a first shape length dimension along the first shape pair of parallel legs parallel to the y-axis, and a first shape width dimension across the first shape pair of parallel legs parallel to the x-axis, the first shape width dimension less than the first shape length dimension, wherein the plurality of second shapes each comprise;
a second shape one hundred eighty degree bend about a second axis orthogonal to the x and y axes to form a second shape pair of parallel legs axis, wherein two ends of the second shape pair of parallel legs distal from the second shape one hundred eighty bend have opposing second shape ninety degree bends; and
a second shape length dimension along the second shape pair of parallel legs parallel to the y-axis, and a second shape width dimension across the second shape pair of parallel legs parallel to the x-axis, the second shape width dimension less than the second shape length dimension, wherein ones of the plurality of first shapes are coupled together at ones of the first shape opposing ninety degree bends; and wherein ones of the plurality of second shapes are coupled together at ones of the second shape opposing ninety degree bends, wherein the magnetic field sensor further comprises:
a first plurality of conductive vias coupled between a portion of a first metal layer and ones of the first shapes proximate to respective ones of the first shape one hundred eighty degree bends;
a second plurality of conductive vias coupled between portion of a second metal layer and ones of the second shapes proximate to respective ones of the second shape one hundred eighty degree bends;
a third plurality of conductive vias coupled between a portion of a third metal layer and ones of the first shapes proximate to respective ones of the first shape opposing ninety degree bends; and
a fourth plurality of conductive vias coupled between a portion of a fourth metal layer and ones of the second shapes proximate to respective ones of the second shape opposing ninety degree bends.

4. The magnetic field sensor of claim 3, wherein the back-biasing magnet comprises:
a solid member having a largest surface parallel to the x-y plane; and
two solid parallel legs extending in a direction perpendicular to the x-y plane, each coupled to a different end of the solid member, wherein the substrate is disposed proximate to the largest surface of the solid member and between the two solid parallel legs.

5. The magnetic field sensor of claim 3, wherein the first, second, third, and fourth metal layers are the same metal layer.

6. A magnetoresistance element structure disposed parallel to an x-y plane defined by an x-axis and a y-axis orthogonal to the x-axis, comprising:
a first plurality of magnetoresistance elements, each having a respective yoke shape and each having a different respective length dimension parallel to the x-y plane, at least one of the first plurality of magnetoresistance elements being nested to fit inside another one of the first plurality of magnetoresistance elements; and
a second plurality of magnetoresistance elements, each having a respective yoke shape and each having a different respective length dimension parallel to the x-y plane, at least one of the second plurality of magnetoresistance elements being nested to fit inside another one of the second plurality of magnetoresistance elements, the first plurality of magnetoresistance elements disposed proximate to the second plurality of magnetoresistance elements, wherein each yoke shape comprises:
a respective elongated member having a length dimension with first and second ends;
a respective first bend member directly coupled to the first end of the elongated member and arranged at ninety degrees relative to the length dimension of the elongated bend member;
a respective second bend member directly coupled to an end of the first bend member and arranged parallel to the length dimension of the elongated bend member;
a respective third bend member directly coupled to the second end of the elongated member and arranged at ninety degrees relative to the length dimension of the elongated bend member; and
a respective fourth bend member directly coupled to an end of the third bend member and arranged parallel to the length dimension of the elongated bend member, wherein the second and fourth bend members have respective length dimensions shorter than the length dimension of the elongated member and wherein the second and fourth bend members are arranged along a common line.

7. The magnetoresistance element structure of claim 6, wherein each one of the first plurality of magnetoresistance elements has a central magnetically active region and wherein the second plurality of magnetoresistance elements has a central magnetically active region, the magnetoresistance element structure further comprising:
a first plurality of conductive vias coupled between a portion of a first metal layer and portions of the first plurality of magnetoresistance elements outside of respective central magnetically active regions of the first plurality of magnetoresistance elements;
a second plurality of conductive vias coupled between a portion of a second metal layer and portions of the second plurality of magnetoresistance elements outside of respective central magnetically active regions of the second plurality of magnetoresistance elements.

8. The magnetoresistance element structure of claim 7, wherein the first and second metal layers are the same metal layer.

9. A magnetic field sensor, comprising:
a back-biasing magnet for generating a back-biasing magnetic field;

a first plurality of magnetoresistance elements, each having a respective yoke shape and each having a different respective length dimension parallel to the x-y plane, at least one of the first plurality of magnetoresistance elements being nested to fit inside another one of the first plurality of magnetoresistance elements; and a second plurality of magnetoresistance elements, each having a respective yoke shape and each having a different respective length dimension parallel to the x-y plane, at least one of the second plurality of magnetoresistance elements being nested to fit inside another one of the second plurality of magnetoresistance elements, the first plurality of magnetoresistance elements disposed proximate to the second plurality of magnetoresistance elements, wherein the first plurality of magnetoresistance elements and the second plurality of magnetoresistance elements experience the back-biasing magnetic field, wherein each yoke shape comprises:

a respective elongated member having a length dimension with first and second ends;

a respective first bend member directly coupled to the first end of the elongated member and arranged at ninety degrees relative to the length dimension of the elongated bend member;

a respective second bend member directly coupled to an end of the first bend member and arranged parallel to the length dimension of the elongated bend member;

a respective third bend member directly coupled to the second end of the elongated member and arranged at ninety degrees relative to the length dimension of the elongated bend member; and a respective fourth bend member directly coupled to an end of the third bend member and arranged parallel to the length dimension of the elongated bend member, wherein the second and fourth bend members have respective length dimensions shorter than the length dimension of the elongated member and wherein the second and fourth bend members are arranged along a common line.

10. The magnetic field sensor of claim 9, wherein the back-biasing magnet comprises:

a solid member having a largest surface parallel to the x-y plane; and two solid parallel legs extending in a direction perpendicular to the x-y plane, each coupled to a different end of the solid member, wherein the substrate is disposed proximate to the largest surface of the solid member and between the two solid parallel legs.

11. The magnetic field sensor of claim 9, wherein each one of the first plurality of magnetoresistance elements has a central magnetically active region and wherein the second plurality of magnetoresistance elements has a central magnetically active region, the magnetoresistance element structure further comprising:

a first plurality of conductive vias coupled between a portion of a first metal layer and portions of the first plurality of magnetoresistance elements outside of respective central magnetically active regions of the first plurality of magnetoresistance elements;

a second plurality of conductive vias coupled between a portion of a second metal layer and portions of the second plurality of magnetoresistance elements outside of respective central magnetically active regions of the second plurality of magnetoresistance elements.

12. The magnetic field sensor of claim 11, wherein the first and second metal layers are the same metal layer.

13. A magnetic field sensor disposed parallel to an x-y plane defined by an x-axis and a y-axis orthogonal to the x-axis, comprising:

a first magnetoresistance element having a plurality of first shapes coupled in series to result in the first magnetoresistance element having a first serpentine shape parallel to the x-y plane;

a second magnetoresistance element having a plurality of second shapes coupled in series to result in the second magnetoresistance element having a second serpentine shape parallel to the x-y plane, wherein the plurality of first shapes and the plurality of second shapes are disposed in first interdigitated pattern;

a third magnetoresistance element having a plurality of third shapes coupled in series to result in the third magnetoresistance element having a third serpentine shape parallel to the x-y plane; and a fourth magnetoresistance element having a plurality of fourth shapes coupled in series to result in the fourth magnetoresistance element having a fourth serpentine shape parallel to the x-y plane, wherein the plurality of third shapes and the plurality of fourth shapes are disposed in a second interdigitated pattern, wherein the first and third magnetoresistance elements are separated by a first distance along a first line, wherein the second and fourth magnetoresistance elements are separated by a second distance along a second line parallel to the first line.

14. The magnetic field sensor of claim 13, further comprising:

a back-biasing magnet for generating a back-biasing magnetic field; and a substrate disposed proximate to the back-biasing magnet, the substrate having a largest surface parallel to the x-y plane, wherein the first, second, third and fourth magnetoresistance elements are disposed upon the substrate.

15. The magnetic field sensor of claim 14, wherein the back-biasing magnet comprises:

a solid member having a largest surface parallel to the x-y plane; and two solid parallel legs extending in a direction perpendicular to the x-y plane, each coupled to a different end of the solid member, wherein the substrate is disposed proximate to the largest surface of the solid member and between the two solid parallel legs, wherein a plane intersects the back-biasing magnet, wherein the first and third magnetoresistance elements are on opposite sides of the plane, and wherein the second and fourth magnetoresistance elements are on the opposite sides of the plane.

16. A magnetic field sensor, comprising:

a first plurality of magnetoresistance elements, each having a respective yoke shape and each having a different respective length dimension parallel to the x-y plane, at least one of the first plurality of magnetoresistance elements being nested to fit inside another one of the first plurality of magnetoresistance elements;

a second plurality of magnetoresistance elements, each having a respective yoke shape and each having a different respective length dimension parallel to the x-y plane, at least one of the second plurality of magnetoresistance elements being nested to fit inside another one of the second plurality of magnetoresistance elements, the first plurality of magnetoresistance elements disposed proximate to the second plurality of magnetoresistance elements;

a third plurality of magnetoresistance elements, each having a respective yoke shape and each having a different respective length dimension parallel to the x-y plane, at least one of the third plurality of magnetoresistance elements being nested to fit inside another one of the third plurality of magnetoresistance elements; and a fourth plurality of magnetoresistance elements, each having a respective yoke shape and each having a different respective length dimension parallel to the x-y plane, at least one of the fourth plurality of magnetoresistance elements being nested to fit inside another one of the fourth plurality of magnetoresistance elements, the third plurality of magnetoresistance elements disposed proximate to the fourth plurality of magnetoresistance elements wherein the first plurality of magnetoresistance elements and the third plurality of magnetoresistance elements are separated by a first distance along a first line, wherein the second plurality of magnetoresistance elements and the fourth plurality of magnetoresistance elements are separated by a second distance along a second line parallel to the first line.

17. The magnetic field sensor of claim 16, wherein each yoke shape comprises:
   a respective elongated member having a length dimension with first and second ends;
   a respective first bend member directly coupled to the first end of the elongated member and arranged at ninety degrees relative to the length dimension of the elongated bend member;
   a respective second bend member directly coupled to an end of the first bend member and arranged parallel to the length dimension of the elongated bend member;
   a respective third bend member directly coupled to the second end of the elongated member and arranged at ninety degrees relative to the length dimension of the elongated bend member; and
   a respective fourth bend member directly coupled to an end of the third bend member and arranged parallel to the length dimension of the elongated bend member, wherein the second and fourth bend members have respective length dimensions shorter than the length dimension of the elongated member and wherein the second and fourth bend members are arranged along a common line.

18. The magnetic field sensor of claim 16, further comprising:
   a back-biasing magnet for generating a back-biasing magnetic field; and
   a substrate disposed proximate to the back-biasing magnet, the substrate having a largest surface parallel to the x-y plane, wherein the first, second, third and fourth pluralities of magnetoresistance elements are disposed upon the substrate.

19. The magnetic field sensor of claim 18, wherein the back-biasing magnet comprises:
   a solid member having a largest surface parallel to the x-y plane; and
   two solid parallel legs extending in a direction perpendicular to the x-y plane, each coupled to a different end of the solid member, wherein the substrate is disposed proximate to the largest surface of the solid member and between the two solid parallel legs, wherein a plane intersects the back-biasing magnet, wherein the first and third pluralities of magnetoresistance elements are on opposite sides of the plane, and wherein the second and fourth pluralities of magnetoresistance elements are on the opposite sides of the plane.

20. A magnetic field sensor, comprising:
   a back-biasing magnet for generating a back-biasing magnetic field;
   a substrate disposed proximate to the back-biasing magnet, the substrate having a largest surface parallel to an x-y plane;
   a first magnetoresistance element disposed upon the substrate and having a plurality of first shapes coupled in series to result in a first serpentine shape parallel to the x-y plane; and
   a second magnetoresistance element disposed upon the substrate and having a plurality of second shapes coupled in series to result in a second serpentine shape parallel to the x-y plane, wherein the plurality of first shapes and the plurality of second shapes are disposed in an interdigitated pattern,
   wherein the first magnetoresistance element and the second magnetoresistance element experience the back-biasing magnetic field, wherein the back-biasing magnet comprises:
   a solid member having a largest surface parallel to the x-y plane; and
   two solid parallel legs extending in a direction perpendicular to the x-y plane, each coupled to a different end of the solid member, wherein the substrate is disposed proximate to the largest surface of the solid member and between the two solid parallel legs.

21. The magnetic field sensor of claim 20, further comprising:
   a first plurality of conductive vias coupled between a portion of a first metal layer and ones of the first shapes;
   a second plurality of conductive vias coupled between a portion of a second metal layer and ones of the second shapes;
   a third plurality of conductive vias coupled between a portion of a third metal layer and ones of the first shapes proximate; and
   a fourth plurality of conductive vias coupled between a portion of a fourth metal layer and ones of the second shapes.

22. The magnetic field sensor of claim 21, wherein the first, second, third, and fourth metal layers are the same metal layer.

23. A magnetic field sensor, comprising:
   a substrate disposed proximate to the back-biasing magnet, the substrate having a largest surface parallel to an x-y plane;
   a first magnetoresistance element disposed upon the substrate and having a plurality of first shapes coupled in series to result in a first serpentine shape parallel to the x-y plane; and
   a second magnetoresistance element disposed upon the substrate and having a plurality of second shapes coupled in series to result in a second serpentine shape parallel to the x-y plane, wherein the plurality of first shapes and the plurality of second shapes are disposed in an interdigitated pattern, the magnetic field sensor further comprising:
   a first plurality of conductive vias coupled between a portion of a first metal layer and ones of the first shapes proximate to respective ones of first shape one hundred eighty degree bends;
   a second plurality of conductive vias coupled between a portion of a second metal layer and ones of the second shapes proximate to respective ones of second shape one hundred eighty degree bends;

a third plurality of conductive vias coupled between a portion of a third metal layer and ones of the first shapes proximate to respective ones of first shape opposing ninety degree bends; and a fourth plurality of conductive vias coupled between a portion of a fourth metal layer and ones of the second shapes proximate to respective ones of second shape opposing ninety degree bends.

24. The magnetic field sensor of claim 23, wherein the first, second, third, and fourth metal layers are the same metal layer.

* * * * *

UNITED STATES PATENT AND TRADEMARK OFFICE
CERTIFICATE OF CORRECTION

PATENT NO. : 10,948,555 B2
APPLICATION NO. : 16/420470
DATED : March 16, 2021
INVENTOR(S) : Sam Tran et al.

It is certified that error appears in the above-identified patent and that said Letters Patent is hereby corrected as shown below:

In the Specification

Column 6, Line 16-17 delete "positions the" and replace with --positions of the--.

Column 6, Line 17 delete "A1 positions" and replace with --A1 and positions--.

Column 6, Line 31 delete "element," and replace with --elements,--.

Column 6, Line 41 delete "signal" and replace with --signals--.

Column 6, Line 42 delete "V," and replace with --V1,--.

Column 6, Line 44 delete "field" and replace with --fields--.

Column 6, Line 52 delete "AA1'," and replace with --A1A1',--.

Column 6, Line 54 delete "electrically can be coupled" and replace with --can be electrically coupled--.

Column 6, Line 66 delete "and" and replace with --an--.

Column 7, Line 7 delete ", A'A2'," and replace with --, A1'A2',--.

Column 8, Line 34 delete "element" and replace with --elements--.

Column 8, Line 49 delete "eighty bend" and replace with --eighty degree bend--.

Column 8, Line 57 delete "eight" and replace with --eighty--.

Column 9, Line 18 delete "elements stacks" and replace with --element stacks--.

Signed and Sealed this
Twenty-eighth Day of June, 2022

Katherine Kelly Vidal
*Director of the United States Patent and Trademark Office*

Column 9, Line 26 delete "layer" and replace with --layers--.

In the Claims

Column 10, Line 17 delete "eighty bend" and replace with --eighty degree bend--.

Column 10, Line 29 delete "eighty bend" and replace with --eighty degree bend--.

Column 10, Line 48 delete "portion" and replace with --portions--.

Column 11, Line 20 delete "eighty bend" and replace with --eighty degree bend--.

Column 11, Line 32 delete "eighty bend" and replace with --eighty degree bend--.

Column 11, Line 50 delete "portion" and replace with --portions--.